United States Patent
Tomita et al.

(10) Patent No.: US 7,442,992 B2
(45) Date of Patent: Oct. 28, 2008

(54) BONDED SOI SUBSTRATE, AND METHOD FOR MANUFACTURING THE SAME

(75) Inventors: Shinichi Tomita, Tokyo (JP); Masahide Tsutsumi, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 11/131,332

(22) Filed: May 18, 2005

(65) Prior Publication Data

US 2006/0055003 A1    Mar. 16, 2006

(30) Foreign Application Priority Data

May 19, 2004   (JP) ............................. P2004-149707

(51) Int. Cl.
*H01L 29/72*   (2006.01)
(52) U.S. Cl. ...................... 257/347; 438/149; 438/455; 438/474
(58) Field of Classification Search ................. 257/347; 438/149, 455, 474
See application file for complete search history.

(56) References Cited

U.S. PATENT DOCUMENTS

2004/0180512 A1* 9/2004 Linn et al. ................... 438/458
2006/0258063 A1* 11/2006 Forbes ......................... 438/149

FOREIGN PATENT DOCUMENTS

JP    08-293589    11/1996

* cited by examiner

*Primary Examiner*—Edward Wojciechowicz
(74) *Attorney, Agent, or Firm*—Pillsbury Winthrop Shaw Pittman, LLP

(57) ABSTRACT

This bonded SOI substrate includes: an SOI layer having a low density impurity layer in which dopants are present at low density and a high density impurity layer in which dopants are present at high density; a wafer for a support substrate which supports said SOI layer; and a buried insulating film, wherein said SOI layer and said wafer for a support substrate are bonded with said buried insulating film therebetween, and gettering sites are formed in said high density impurity layer.

10 Claims, 4 Drawing Sheets

BONDED SOI SUBSTRATE, AND METHOD FOR MANUFACTURING THE SAME

BACKGROUND OF THE INVENTION

1. Field of the Invention

The present invention relates to a bonded SOI substrate and a method for manufacturing the same, and more particularly it relates to a bonded SOI substrate in which gettering sites are formed in an SOI layer, and a method for manufacturing the same.

This application claims priority from Japanese Patent Application No. 2004-149707 filed on May 19, 2004, the content of which is incorporated herein by reference.

2. Background Art

As one example of bonded substrates in which two silicon wafers are bonded together, a bonded SOI (Silicon On Insulator) substrate is known. This includes an SOI layer (an active layer) on a surface of which a device is formed, a wafer for a support substrate which supports the active layer from its rear surface, and an insulating film (a silicon oxide film) buried therebetween. In the prior art, there has also been disclosed a bonded SOI substrate in which a high density $n^+$ layer is formed by ion implantation in an n-type SOI layer.

In the following, with reference to the flow sheet of FIG. 5, a prior art method for manufacturing such a bonded SOI substrate which incorporates an $n^+$ layer is explained.

As shown in this figure, a single crystal silicon ingot is pulled out by the CZ method in which a predetermined amount of arsenic or antimony is doped. And then, the obtained single crystal silicon ingot is subjected to block sectioning, notch processing, slicing, surface trimming, polishing a surface to a mirror finish, and the like in regular succession. By these processes, an n-type wafer 101 for the active layer of 8 inches in diameter and having a mirror finished surface is prepared (see FIG. 5 (a)). On the other hand, a similar wafer 102 for the support substrate of which the surface is smoothed to a mirror finish is prepared by the same manufacturing process as for the wafer 101 for the active layer (see FIG. 5 (b)). And then, the wafer 102 for the support substrate is placed in a thermal oxidization furnace, and an insulating silicon oxide film 102a is formed in its surface by a thermal oxidization processing.

Next, the wafer 101 for the active layer is loaded into a medium current ion implantation device, and arsenic or antimony, which is an n-type dopant, is implanted in the wafer surface under conditions in which for example, an implantation energy is 80 keV and a dose amount is $2 \times 10^{15}$ atoms/cm$^2$. Thereby, an ion implantation layer I is formed to a predetermined depth in the surface layer of this wafer 101 for the active layer.

After this process, the two wafers 101 and 102 are bonded together with their mirror finished surfaces facing one another at room temperature in a clean room (see FIG. 5 (c)). Thereby, a bonded wafer 103 is manufactured. Due to this bonding, a portion of the silicon oxide film 102a which is sandwiched between the wafer 101 for the active layer and the wafer 102 for the support substrate becomes a buried silicon oxide film 102b.

Next, the resulting bonded wafer 103 is placed into a thermal oxidization furnace for bonding, and heat-treating for bonding is performed in an atmosphere of oxygen gas. A temperature for this heat-treating for bonding is 1100° C., and heat-treating time is 2 hours (see FIG. 5 (c)). Thereby, a silicon oxide film is formed over the entire exposed surface of the bonded wafer 103. At this time, the arsenic or antimony in the ion implantation layer I is diffused thermally in a vicinity of a bonded surface side of the wafer 101 for the active layer, thereby an $n^+$ layer (a high density impurity layer) 101a is formed. As a result, if the wafer 101 for the active layer includes a buried silicon oxide (SiO$_2$) layer 102b, the wafer 101 for the active layer has an n/n$^+$/SiO$_2$ structure.

Next, void detection is performed using ultrasonic irradiation. For a bonded wafer 103 to be of good quality, defective bonding regions caused by shapes of chamfered outer peripheral portions of the two wafers 101 and 102 are removed. Specifically, the outer peripheral portion of the wafer 101 for the active layer is ground from its device fabrication surface side using a metal-bonded grinding stone of #800 to #1500 grade (see FIG. 5 (d)). This grinding of the outer peripheral portion is stopped before reaching a bonded boundary surface.

Next, a remaining non-ground portion 101c is removed by alkali etching (see FIG. 5 (e)). In detail, the bonded wafer 103 is immersed into an alkaline etching solution such as KOH or the like, thereby the remaining non-ground portion 101c is dissolved (etching of the outer peripheral portion). Accordingly, the outer peripheral portion of the wafer for the support substrate 102, in detailed terms, the outer peripheral portion of the buried silicon oxide film 102b, is exposed.

Next, the surface of the wafer 101 for the active layer is ground and polished from its device fabrication surface side. Accordingly, a bonded SOI substrate is manufactured in which an SOI layer 101A having an n/n$^+$/SiO$_2$ structure is formed (see FIG. 5 (f)).

Here, in a device process for fabricating a semiconductor device in the SOI layer 101A of this bonded SOI substrate, a degree of contamination of metallic impurities (iron, copper, nickel, or the like) in the SOI layer 101A having the n$^+$ layer 101a is considered to be very important. Furthermore, as a specific problem for bonded SOI substrates accompanying ion implantation, metallic contamination is caused in an ion implantation process and a subsequent high temperature heat-treating process (for example, thermal oxidation or heat-treating for bonding).

In the case in which metallic contamination caused in these processes remains in the SOI layer 101A even after product delivery, defects are generated or electrical potentials are formed in a vicinity of the surface of the SOI layer 101A, and device characteristics are deteriorated. This problem also occurs in the case in which metallic contamination is caused in the device process. As a result, a yield rate for the devices drops. Thus, in recent years there has been a demand for a gettering effect on bonded SOI substrates which prevents generation of defects and formation of electrical potentials in the vicinity of the surface of the SOI layer 101A to be exerted for a sustainable term from ion implantation through to device processing.

In a prior art, a method as described in Patent Document 1 is known as a countermeasure against such metallic contamination. In this method, along with forming oxygen precipitates over substantially the entire wafer for a support substrate which become gettering sites for metallic impurities, dislocation groups are formed in a vicinity of the buried oxide film of the support substrate wafer. All of these oxygen precipitates and dislocation groups make up an IG (Intrinsic Gettering) layer which is formed in the wafer for a support substrate.

However, according to such a prior art method for manufacturing a bonded SOI substrate, since the IG layer is formed in the wafer for a support substrate in this manner, iron, nickel, or the like in the SOI layer, of which diffusion rates in the buried oxide film are slow (cannot pass through the buried oxide film), are not easily gettered by the IG layer in the wafer for a support substrate.

Moreover, in the CZ method, dopants tend to segregate into a portion of a silicon single crystal ingot when pulling up the ingot. This segregation caused a variation in resistance (unevenness of dopant concentration) of about 25% among sliced silicon wafers (wafers for active layers). Furthermore, even in an in-plane direction of one silicon wafer, a variation in resistance of about 10% occurred. Regarding these, in a device factory, as a pretreatment prior to fabricating a device in an SOI layer of a bonded SOI substrate, a predetermined amount of dopants were implanted into the SOI layer so as to adjust the resistance in the in-plane direction of the wafer and the resistances among the wafers. As a result, manufacturing cost of the bonded SOI substrate was increased.

On the other hand, as another method for equalizing the resistance in the in-plane direction of the wafer and the resistances among the wafers, for example, a method is known in which a silicon oxide film is formed in a surface of the wafer for a support substrate and epitaxial growth of Si is conducted thereon so as to deposit the SOI layer.

However, since epitaxial growth is conducted, the manufacturing cost of this method was also high compared with a general bonded SOI substrate manufactured by simply bonding the wafer for an active layer and the wafer for a support substrate and then grinding and polishing the wafer for an active layer from its rear surface side so as to be thinned.

Patent Document 1: Japanese Unexamined Patent Application, First Publication No. H08-298589.

SUMMARY OF THE INVENTION

As a result of intensive investigations, the present inventors have discovered that in the case in which gettering sites are formed in an $n^+$ layer of a wafer for an active layer in advance, metallic impurities such as iron, nickel, or the like which exist in an SOI layer and of which diffusion rates in a buried insulating film are slow (cannot pass through) can be gettered by these gettering sites. And the present inventors have realized the present invention based upon these results.

Moreover, as a result of intensive investigations, formation of gettering sites in an SOI layer can be accomplished by implanting a predetermined amount of dopants into a wafer for an active layer followed by forming an oxide film in the wafer for an active layer, and then bonding the wafer for an active layer with a wafer for a support substrate followed by heat-treating so as to diffuse the dopants thermally to the periphery, and subjecting the bonded wafer for an active layer to a thinning treatment. Accordingly, the inventors found that it is possible to reduce variation in resistance in the in-plane direction of the wafer and variation in resistance among the wafers and to form the gettering sites in the SOI layer. And the present inventors have realized the present invention based upon these results.

By forming the gettering sites on a buried oxide film side in the SOI layer as described above, metallic impurities adhered on a surface of the SOI layer, metallic impurities present in the SOI layer, and the like can be gettered immediately in the above described buried oxide film during thermal processing in a device process.

The present invention aims to provide a bonded SOI substrate which can perform gettering of metallic impurities in the SOI layer during thermal processing in a device process, and a method for manufacturing the same.

Also, the present invention aims to provide a method for manufacturing a bonded SOI substrate which can perform gettering of metallic contaminants which contaminated a surface layer of the wafer for an active layer during ion implantation.

Furthermore, the present invention aims to provide a method for manufacturing a bonded SOI substrate which can prevent the SOI layer from being thick due to spread of an $n^+$ layer.

Also, the present invention aims to provide a bonded SOI substrate in which variation in resistance in the in-plane direction of the wafer and variation in resistance among the wafers can be reduced and which can perform gettering of metallic impurities in the SOI layer during thermal processing in a device process.

A first aspect of the bonded SOI substrate according to the present invention is characterized by including: an SOI layer having a low density impurity layer in which dopants are present at low density and a high density impurity layer in which dopants are present at high density; a wafer for a support substrate which supports the SOI layer; and a buried insulating film, wherein the SOI layer and the wafer for a support substrate are bonded with the buried insulating film therebetween, and gettering sites are formed in the high density impurity layer.

According to the first aspect of the bonded SOI substrate, the gettering sites are formed in the high density impurity layer of the SOI layer. Thereby, during thermal processing in a device process, metallic impurities such as iron, nickel or the like which cannot pass through the buried insulating film present in the SOI layer are gettered by the gettering sites of the high density impurity layer. As a result, it is possible to suppress deterioration of device characteristics caused by generation of lattice defects and formation of electrical potentials in a vicinity of a surface of the SOI layer due to metallic contamination of metallic impurities in the SOI layer. Accordingly, yield rate of the devices can be improved.

As the dopant, it is possible to employ an n-type dopant such as arsenic, antimony, phosphorus or the like, or a p-type dopant such as boron or the like.

As the wafer for an active layer and the wafer for a support substrate, it is possible to employ, for example, a silicon wafer. The wafer for an active layer and the wafer for a support substrate may be n-type silicon wafers in which n-type impurities are doped in advance, or may be p-type silicon wafers which include p-type impurities.

A bonded surface of the wafer for an active layer which is bonded with the wafer for a support substrate is a surface on the high density impurity layer side.

As the buried insulating film, it is possible to employ, for example, a buried silicon oxide film, a buried silicon nitride layer or the like.

A thickness of the SOI layer is not particularly limited. The thickness is, for example, in a range from 1 to 50 μm, and preferably 5 μm or more.

A density difference between a dopant density of the high density impurity layer and a dopant density of the low density impurity layer is not particularly limited. For example, the dopant density of the high density impurity layer may be $1 \times 10^{18}$ atoms/cm$^3$ or more, and preferably in a range from $1 \times 10^{19}$ to $1 \times 10^{20}$ atoms/cm$^3$. The low density impurity layer and the high density impurity layer are of the same electrode type.

As the gettering sites, it is possible to employ, for example, lattice defects. The lattice defects include point defects, line defects, plane defects, and body defects. For forming the high density layer in a substrate in which the density of impurities is low, there are, for example, methods of epitaxial growth, thermal diffusion of impurities, or the like.

A second aspect of the bonded SOI substrate according to the present invention is characterized by including: an SOI layer having a low density impurity layer in which dopants are present at low density and a high density impurity layer obtained by heat-treating an ion implantation layer in which dopants are implanted at high density; a wafer for a support substrate which supports the SOI layer; and a buried insulating film, wherein the SOI layer and the wafer for a support substrate are bonded with the buried insulating film therebetween, and gettering sites are formed in the high density impurity layer.

According to the second aspect of the bonded SOI substrate, the gettering sites are formed in the high density impurity layer which is formed by ion implantation. Metallic impurities are gettered by these gettering sites.

A third aspect of the bonded SOI substrate according to the present invention is characterized by including: an SOI layer having dopants at a predetermined density; a wafer for a support substrate which supports the SOI layer; and a buried insulating film, wherein the SOI layer and the wafer for a support substrate are bonded with the buried insulating film therebetween, each of a variation in resistance among wafers and a variation in resistance of the SOI layer in an in-plane direction is 5% or less, and gettering sites are formed in a buried insulating film side of the SOI layer.

In the third aspect of the bonded SOI substrate, a predetermined amount of dopants are implanted in a wafer for an active layer, and then the wafer for an active layer is heat-treated to oxidize so as to form an oxide film. When forming the oxide film, an amorphous layer which is formed to be amorphous by the ion implantation is recrystallized. However, since interstitial oxygen and interstitial silicons are supplied to the amorphous layer, the wafer for an active layer is prevented from becoming a single crystal and lattice defects such as dislocations and stacking faults are generated. Furthermore, the implanted dopants are thermally diffused by heat when heat-treating to oxidize.

Next, the wafer for an active layer and the wafer for a support substrate are bonded together so as to form a bonded wafer. And then, the bonded wafer is heat-treated for bonding. At this time, the implanted dopants are thermally diffused further to the periphery. Next, the wafer for an active layer is subjected to a thning treatment (for example, grinding and polishing) so as to form an SOI layer which includes a diffusion layer of the dopants. Here, the thinning treatment may be conducted before heat-treating for bonding.

Accordingly, each of a variation in resistance (dopant concentration) among wafers and a variation in resistance (dopant concentration) of the SOI layer in the in-plane direction can be reduced to 5% or less. Also, gettering sites are formed in a buried insulating film side of the SOI layer. Therefore, metallic impurities adhered to a surface of the SOI layer and metallic impurities (in particular, iron, nickel or the like, which has difficulty passing through the buried oxide film) can be gettered in the SOI layer during thermal processing in a device process.

Here, the variation in resistance of the SOI layer among wafers is defined as a variation in resistance between SOI layers of two bonded substrates selected arbitrarily among a plurality of bonded substrates formed from a plurality of wafers obtained from one single crystal ingot.

The variation in resistance of the SOI layer in the in-plane direction is defined as a variation in distribution of resistance over the whole surface of an SOI layer in each of a plurality of bonded substrates formed from a plurality of wafers obtained from one single crystal ingot.

In the case in which the variation in resistance is more than 5%, there is a disadvantage in that an adjustment treatment is further needed in a device process. The variation in resistance is preferably 5% or less. Within this range, a more preferred effect of quality stabilization can be obtained.

As the gettering sites, it is possible to employ, for example, the lattice defects as described above (dislocations, stacking faults or the like).

In the first through the third aspects of the bonded SOI substrate, the gettering sites may be dislocations or stacking faults.

In the case in which a stress (compression, extension, or shear) generated in a crystal exceeds a yield point for elastic deformation of the crystal, partial regions of the crystal are displaced along sliding surfaces at a distance of a constitutional repeating unit of a crystal lattice, thereby the stress is relieved. At ends of boundary surfaces (the sliding surfaces) between displaced regions and non-displaced regions, asymmetric interatomic bonds occur. Linear regions in which the asymmetry occurs are dislocations. Generally, they become multiple dislocations. Size of the dislocations is approximately in a range from 0.01 to 0.10 µm.

Furthermore, at the $\{111\}$ surface of a silicon crystal which has a diamond crystalline structure, constitutional repeating units are overlapped in a plane orientation to form crystals. Portions in which excessive atomic planes are interrupted into this orientation or portions in which atomic planes are missing from this orientation are stacking faults.

Density of dislocations and density of stacking faults are, for example, in a range from $1\times10^0$ to $1\times10^7/cm^2$. If there are less than $1\times10^0/cm^2$ of dislocations and stacking faults, the gettering is insufficient. If there are more than $1\times10^7/cm^2$ of dislocations and stacking faults and the density of dislocations is high, when forming trench grooves in the SOI layer in a device process, the dislocations turn into slip dislocations.

A fourth aspect of the bonded SOI substrate according to the present invention is characterized by including: an SOI layer throughout which implanted dopants are thermally diffused; a wafer for a support substrate which supports the SOI layer; and a buried insulating film, wherein the SOI layer and the wafer for a support substrate are bonded with the buried insulating film therebetween, and each of a variation in resistance among wafers and a variation in resistance of the SOI layer in the in-plane direction is 5% or less.

A first aspect of the method for manufacturing a bonded SOI substrate according to the present invention is characterized by including: a step of forming a high density impurity layer which includes dopants at high density in a surface side of a wafer for an active layer which includes dopants at low density; a step of generating dislocations or stacking faults in a vicinity of a surface of the high density impurity layer in the wafer for an active layer; and a bonding step of bonding the wafer for an active layer and a wafer for a support substrate which supports the wafer for an active layer with a buried insulating film therebetween.

According to the first aspect of the method for manufacturing a bonded SOI substrate, since dislocations or stacking faults are generated in the high density impurity layer of the SOI layer as gettering sites, during thermal processing of the device process, metallic impurities present in this SOI layer are gettered by the dislocations or the stacking faults due to the heat of this thermal processing. As a result, it is possible to suppress deterioration of device characteristics caused by generation of lattice defects and formation of electrical potentials in a vicinity of a surface of the SOI layer due to metallic contamination in the SOI layer. Accordingly, yield rate of the devices can be improved.

Formation of the high density impurity layer may be performed by, for example, an epitaxial growth method, a thermal diffusion method, or the like.

A second aspect of the method for manufacturing a bonded SOI substrate according to the present invention is characterized by including: an ion implanting step of implanting dopants in a surface side of a wafer for an active layer in which dopants are present at low density so as to form an ion implantation layer; a heat-treating step of heat-treating the wafer for an active layer after the ion implantation, thereby making the ion implantation layer be a high density impurity layer along with forming an oxide film in an ion implanted surface of the wafer for an active layer so as to generate dislocations or stacking faults in a vicinity of a surface of the high density impurity layer; an oxide film removing step of removing the oxide film; and a bonding step of bonding the wafer for an active layer and the wafer for a support substrate which supports the wafer for an active layer with a buried insulating film therebetween.

According to the second aspect of the method for manufacturing a bonded SOI substrate, since dislocations or stacking faults are generated in the high density impurity layer of the SOI layer as gettering sites, during thermal processing of the device process, metallic impurities such as iron, nickel, or the like which are present in the SOI layer and cannot pass through the buried insulating film diffuse due to the heating, and the diffused metallic impurities present in the SOI layer are gettered by the dislocations or the stacking faults. As a result, it is possible to suppress deterioration of device characteristics caused by generation of lattice defects and formation of electrical potentials in a vicinity of a surface of the SOI layer due to metallic contamination in the SOI layer. Accordingly, yield rate of the devices can be improved.

Furthermore, since in the step of forming the oxide film in the ion implanted surface of the wafer for an active layer so as to generate dislocations or stacking faults, heat-treating is performed in a state in which oxygen is present in the surface and/or in an interface of the oxide film, a plurality of interstitial silicons are generated at an Si—SiO$_2$ interface. These are accumulated at portions damaged by ion implantation, thereby dislocations or stacking faults are generated.

Also, in the case in which the surface of the wafer for an active layer is contaminated by metallic contaminants such as boron, aluminum, or the like, due to oxidation of the ion implantation surface or due to, for example, cross contamination during the ion implantation, the metallic contaminants are taken in an oxide film by oxidizing an ion implanted surface. Due to this, by removing the oxide film during the subsequent oxide film removing process, these metallic contaminants are also removed from the surface of the wafer for an active layer.

Here, ion implantation is a method in which, using an ion implantation device, n-type or p-type dopants are gasified and ionized, and then accelerated by an electric field, and is shot at an exposed surface of the wafer, thus being buried in the wafer. An energy of about 10 to 200 keV is imparted by an acceleration system to impurity atoms which are ionized by a high frequency discharge of an ion generation section; and then, only desirable ions are selected in a mass analysis system, and are buried in the wafer for an active layer while being scanned in X and Y directions by a deflection system. For example, if a medium current ion implantation device is used, in an energy region from a few keV to a few hundred keV, it is possible to implant a medium amount of dose or a low amount of dose of $1 \times 10^{14}$ atoms/cm$^2$ or less with good accuracy and at high productivity.

The ion implantation devices are classified according to a beam current obtained for ions. Examples of these may include a medium-current ion implantation device, a large-current ion implantation device, a high energy ion implantation device, and the like. These ion implantation devices principally include ion generation, a mass analysis device, an accelerating tube, an ion deflection system, and an ion implantation chamber. These are operated in a high vacuum system. In ion implantation using these ion implantation devices, particular ions specified by the mass analysis device are extracted and accelerated. Here, it may also be acceptable to specify the ions after being accelerated.

In the case in which there is a concern about metallic contamination due to cross contamination during the ion implantation, a screen oxide may be formed in advance in the wafer for an active layer, and then the ion implantation may be performed. In this case, it is necessary to remove the screen oxide from the wafer for an active layer after the ion implantation and then to perform SC-1 cleaning and SC-2 cleaning. In the case in which there is no concern about cross contamination, it is not necessary to form the screen oxide, and the wafer for an active layer is subjected to the SC-1 cleaning and the SC-2 cleaning after the ion implantation.

Examples of the method for forming the buried insulating film include a method in which an insulating film (for example, a silicon oxide film) is formed in the wafer for an active layer and/or the wafer for a support substrate and then both of the wafers are bonded together. In this case, the insulating film may be formed in either of the wafer for an active layer and the support substrate wafer. Alternatively, the insulating films may be formed in both of the wafers. The method for forming the insulating film is not particularly limited. For example, if the insulating film is an oxide film, examples of the method include dry oxidization, wet oxidization, or the like.

The bonding step may be, for example, performed after the oxide film removing step.

The bonding of the two wafers may be performed, for example, at room temperature. After this, the obtained bonded wafers may be subjected to a heat treatment for bonding. The heating temperature for this heat treatment for bonding is 800° C. or higher, and for example, 1100° C. The heating time for this heat treatment for bonding is, for example, two hours. Examples of an ambient gas may include oxygen or the like. During this heat treatment for bonding, the dopants in the ion implantation layer of the wafer for an active layer may be diffused thermally so as to form a high density impurity layer.

Thereafter, the bonded wafers I are subjected to a surface treatment of thinning the wafer for an active layer. In detail, examples of the treatment include grinding and surface polishing. The examples may also include etching.

Temperature of the heat treatment for generating dislocations or stacking faults is in a range from 400° C. to 1200° C., and is preferably in a range from 800° C. to 1000° C. In the case in which the temperature is less than 400° C., growth rate of the oxide film is slow. In the case in which the temperature is more than 1200° C., the thickness of the high density impurity layer becomes too thick.

The atmosphere for forming the oxide film is a dry atmosphere or a pyrogenic atmosphere.

The ion implantation surface in which the oxide film is formed is the ion implantation surface (the wafer surface) of the wafer for an active layer.

The oxide film is formed in the ion implantation surface side of the wafer for an active layer in such a way that the oxide film is brought in continuity with the ion implantation layer in the thickness direction of the wafer for an active layer.

The thickness of the oxide film is preferably in a range from 10 to 500 nm. The thickness of this oxide film may be selected appropriately according to the type of dopant, the implantation energy, the dose amount, and the like.

If the density of the dislocations is high, there is a concern that the dislocations will change into slip dislocations when forming trench grooves in the SOI layer during a device process.

In the first and the second aspects of the methods for manufacturing a bonded SOI substrate, an insulating film which becomes the buried insulating film may be formed only in the wafer for a support substrate.

In the case in which the insulating film is formed in the ion implantation surface (the bonded surface) of the wafer for an active layer, the heating time becomes long. Thereby, the dopants diffuse within the wafer for an active layer and the high density impurity layer becomes thick.

In the case in which the insulating films are formed in the wafer for an active layer and in the wafer for a support substrate, it is necessary to heat-treat at high temperature during the heat-treating for bonding. Thereby, the high density impurity layer becomes even thicker.

Considering these factors, it would be better to form the insulating film only in the wafer for a support substrate and then to bond the two wafers so as to suppress an increase in the thickness of the high density impurity layer in the subsequent thermal processing process. Accordingly, it is possible to shorten a time period for forming the trench grooves in the device process. Therefore, it becomes possible to reduce the manufacturing cost of the device.

A third aspect of a method for manufacturing a bonded SOI substrate according to the present invention is characterized by including: a step of implanting dopants into a wafer for an active layer which is non-doped or in which dopants are present at low density from a surface of the wafer for an active layer; a step of heat-treating the wafer for an active layer in an oxygen atmosphere after the ion implantation, thereby forming an oxide film in the surface of the wafer for an active layer along with diffusing the implanted dopants thermally; a step of, after the ion implantation, bonding the wafer for an active layer and a wafer for a support substrate in a state such that a surface in which the oxide film is formed be a bonded surface so as to make the oxide film intervening between both wafers be a buried oxide film; a step of, after the bonding, heat-treating for bonding so as to strengthen the bonding between the wafer for an active layer and the wafer for a support substrate; and a step of, after the bonding, subjecting the wafer for an active layer to a thinning treatment from a rear surface of the wafer for an active layer so as to make a portion in which implanted dopants are diffused in the wafer for an active layer be an SOI layer.

According to the third aspect of the method for manufacturing a bonded SOI substrate, after implanting a predetermined amount of dopants into a wafer for an active layer, an oxide film is formed in the wafer for an active layer. However, since interstitial oxygen and interstitial silicons are supplied to an amorphous layer, the wafer for an active layer is prevented from becoming a single crystal and lattice defects such as dislocations and stacking faults are generated. Furthermore, the implanted dopants are thermally diffused by heat when heat-treating to oxidize. And then, the wafer for an active layer and a wafer for a support substrate are bonded together, and the bonded wafer is subjected to heat-treating. At this time, the implanted dopants are thermally diffused. Here, under conditions of heat-treating for bonding, it is impossible to make the amorphous layer be a perfect single crystal. Therefore, a portion of the amorphous layer remains as lattice defects in a buried oxide film side of the SOI layer. Next, the wafer for an active layer is subjected to a thinning treatment so as to form an SOI layer which includes a diffusion layer of the dopants. Accordingly, each of a variation in resistance among wafers and a variation in resistance of the SOI layer in the in-plane direction can be reduced to 5% or less. Also, gettering sites are formed in a buried insulating film side of the SOI layer. Therefore, metallic impurities adhered to a surface of the SOI layer and metallic impurities present in the SOI layer can be gettered in the SOI layer during a thermal processing in a device process. In particular, the effects are quite noticeable for the case in which the metallic impurities in the SOI layer are iron, nickel or the like, which do not pass through the buried oxide film even when thermally diffusing. The thinning treatment may be performed before the heat-treating for bonding.

Here, the wafer for an active layer which is non-doped is a wafer for an active layer in which dopants are not present.

The wafer for an active layer in which dopants are present at low density is a wafer for an active layer having a predetermined amount of dopants which have no influence. In this case, dopants included in the wafer for an active layer at low density may be different from implanting dopants.

The atmosphere for forming the oxide film is a dry atmosphere or a pyrogenic atmosphere.

A temperature for forming the oxide film is in a range from 800 to 1200° C. In the case in which the temperature is less than 800° C., it takes a long time to form the oxide film and the diffusion rate of the dopants is slow, which is disadvantageous as the process takes a long time. In the case in which the temperature is more than 1200° C., there is a disadvantage in that slippage and metallic contamination easily occur.

The oxide film is formed at a predetermined thickness.

A temperature of a heat-treating for bonding the wafer for an active layer and the wafer for a support substrate is in a range from 1000 to 1200° C. In the case in which the temperature is less than 1000° C., disadvantages occur that the strength of bonding is weak and diffusion rate of the dopants is slow. In the case in which the temperature is more than 1200° C., disadvantages occur in that slippage and metallic contamination easily occur. A temperature of a heat-treating for bonding is preferably in a range from 1150 to 1200° C.

A method for thinning the wafer for an active layer from a rear surface side (a method of surface treatment for thinning the wafer for an active layer) is not limited. Examples of the method include grinding and polishing the wafer for an active layer from its rear surface side. The examples may also include etching (various dry etchings and wet etchings).

In the third aspect of the method for manufacturing a bonded SOI substrate, an oxide film may be formed in the wafer for a support substrate before bonding with the wafer for an active layer.

A fourth aspect of a method for manufacturing a bonded SOI substrate according to the present invention is characterized by including: a step of implanting dopants into a wafer for an active layer which is non-doped or in which dopants are present at low density from a surface of the wafer for an active layer; a step of, after the ion implantation, bonding the wafer for an active layer and a wafer for a support substrate on the surface of which an oxide film is formed in a state such that an implanted surface be a bonded surface so as to make the oxide film intervening between both wafers be a buried oxide film; a step of, after the bonding, heat-treating for bonding so as to strengthen the bonding between the wafer for an active layer and the wafer for a support substrate, thereby diffusing the implanted dopants thermally; and a step of, after the bonding, subjecting the wafer for an active layer to a thinning treatment from a rear surface of the wafer for an active layer so as to make a portion in which the implanted dopants are diffused in the wafer for an active layer be an SOI layer.

According to the first through the third aspects of the bonded SOI substrates and the second aspect of the method for manufacturing an SOI substrate, since the gettering sites are formed in the high density impurity layer of the SOI layer, metallic impurities present in the SOI layer are gettered by the gettering sites during a thermal processing of a device process. As a result, it is possible to suppress deterioration of device characteristics caused by generation of lattice defects and formation of electrical potentials in a vicinity of a surface of the SOI layer due to metallic contamination in the SOI layer. Accordingly, yield rate of the devices can be improved.

In particular, according to the second aspect of the method for manufacturing an SOI substrate, in the step of forming the oxide film in the ion implantation layer of the wafer for an active layer so as to generate dislocations or stacking faults, the heat-treating is performed in a state in which oxygen is present in a surface and/or in an interface of the oxide film. Therefore, a plurality of interstitial silicons are generated at $Si$—$SiO_2$ interfaces. These interstitial silicons are accumulated at portions damaged by ion implantation, thereby dislocations or stacking faults are generated.

Furthermore, in the case in which the surface of the wafer for an active layer is contaminated by a metallic contaminant such as boron, aluminum, or the like due to, for example, cross contamination during the ion implantation, the metallic contaminant is taken in an oxide film by oxidizing an ion implanted surface. Due to this, by removing the oxide film during the subsequent oxide film removing process, these metallic impurities are also removed from the surface of the wafer for an active layer. According to the first and the second aspects of the bonded SOI substrates, in the case in which the insulating film is formed only in the wafer for a support substrate, an increase in the thickness of the high density impurity layer can be suppressed in a subsequent thermal processing process. Accordingly, it is possible to shorten a time period for forming trench grooves in a device process. Therefore, it becomes possible to reduce the manufacturing cost of the device.

Furthermore, according to the fourth aspect of the bonded SOI substrate and the third aspect of the method for manufacturing an SOI substrate, after forming the oxide layer in the wafer for an active layer in which dopants are implanted, the wafer for an active layer and the wafer for a support substrate are bonded together and heat-treated, and then the wafer for an active layer is subjected to the thinning treatment so as to form the SOI layer which includes a diffusion layer of dopants. Thereby, each of a variation in resistance among wafers and a variation in resistance of the SOI layer in the in-plane direction can be reduced to 5% or less, and gettering sites for metallic impurities and the like can be formed in the SOI layer.

PREFERRED EMBODIMENTS

In the following, a preferred embodiment of the present invention will be described with reference to the drawings.

EXAMPLE 1

Figure 1:
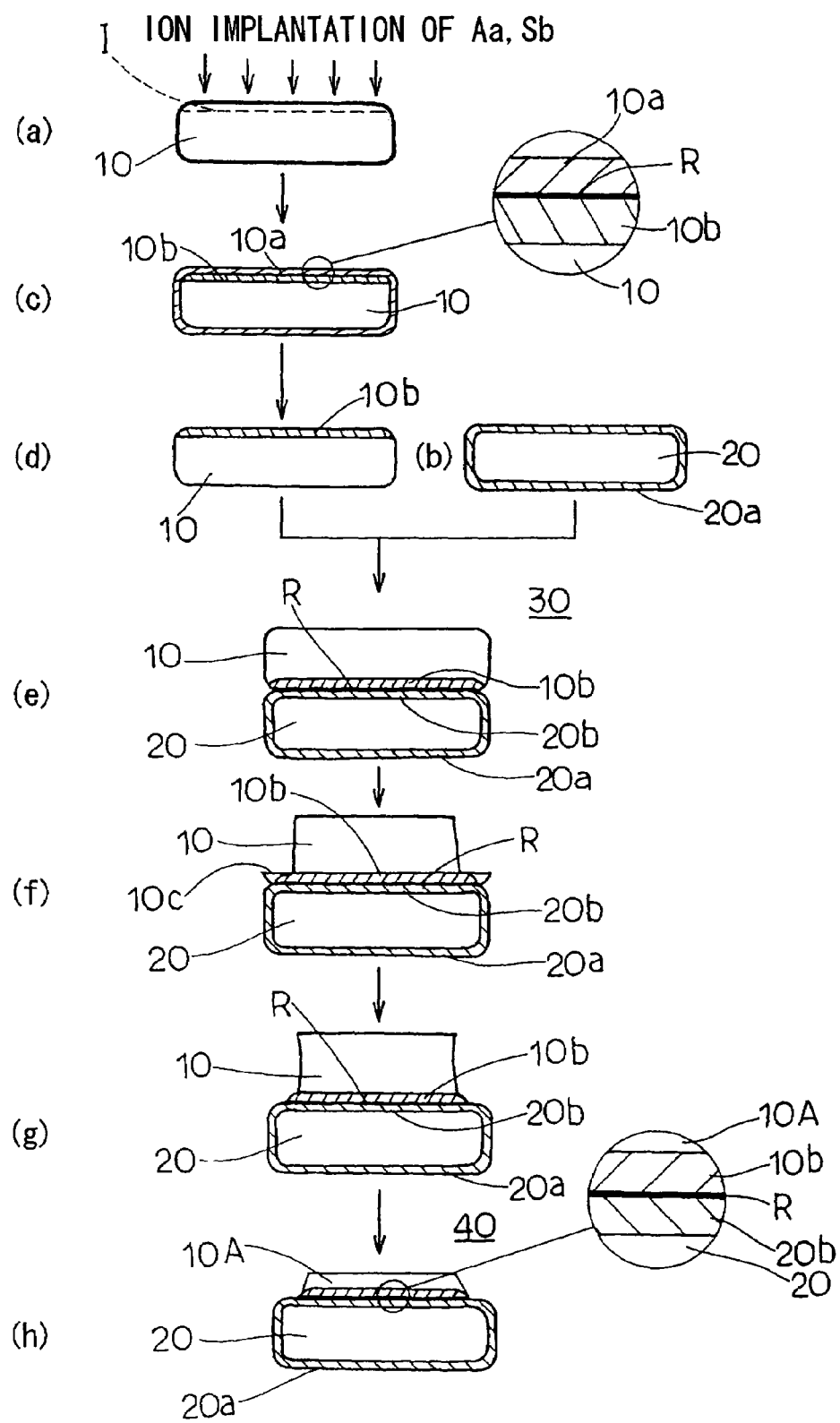
FIG. 1 is a flow diagram showing a method for manufacturing a bonded SOI substrate according to Example 1 of the present invention.

As shown in FIG. 1, a single crystal silicon ingot doped with a predetermined amount of arsenic or antimony is pulled up by the CZ method (alternatively, the FZ method may be applied). And then, the obtained single crystal silicon ingot is subjected to block cutting, a notching process, slicing, chamfering, mirror polishing of a surface, and the like. Thereby, a mirror-polished n-type wafer for an active layer 10 of 8 inches in diameter is prepared (see FIG. 1(*a*)). In contrast, a similar mirror-polished wafer for a support substrate 20 is prepared by the same manufacturing process as for the wafer for an active layer 10 (see FIG. 1(*b*)). Next, the wafer for the support substrate 20 is put into a thermal oxidization furnace, and is subjected to a thermal oxidization process in an atmosphere of water vapor at a temperature of 1050° C. for four hours. Thereby, a silicon oxide film (an insulating film) 20*a* having a thickness of 1.0 μm is formed.

Next, from a surface of the wafer for an active layer 10, an n-type dopant of arsenic or antimony is implanted at, for example, an implantation energy of 80 keV and a dose amount of $2 \times 10^{15}$ atoms/cm$^2$. Thereby, an ion implantation layer I is formed at a predetermined depth in a surface layer of the wafer for an active layer 10.

Figure 2:
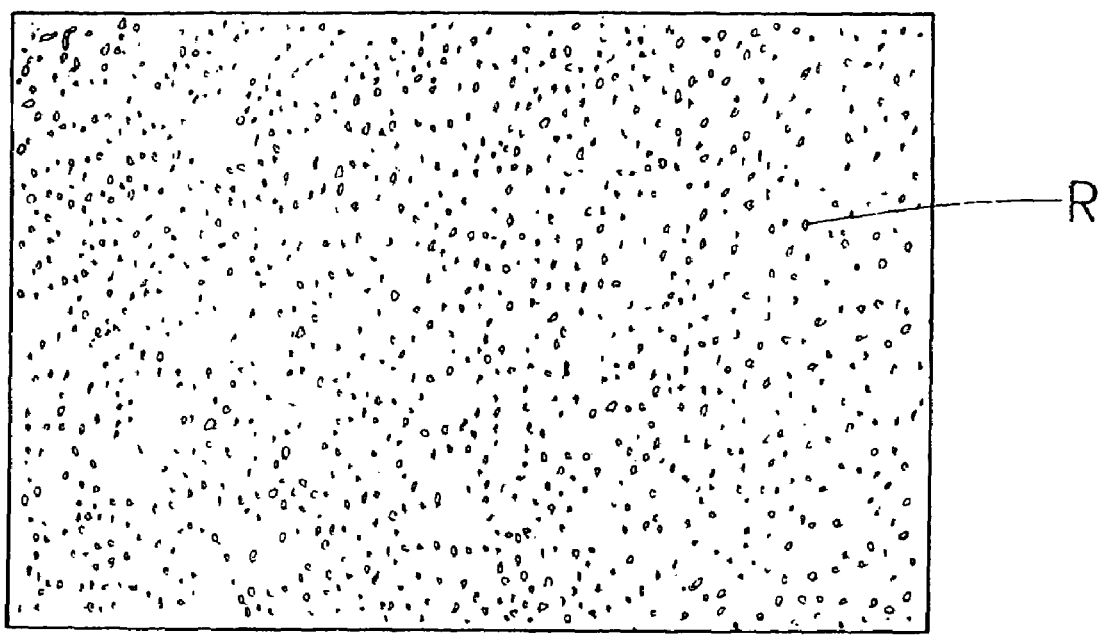
FIG. 2 is a microscope photograph of lattice defects generated at a Si—$SiO_2$ layer boundary in an active layer of the present invention.
Figure 3:
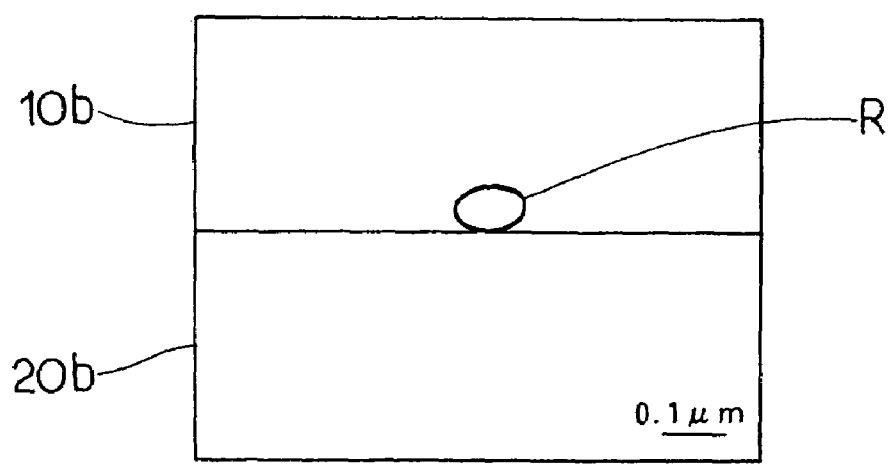
FIG. 3 is a schematic figure showing a TEM photograph of lattice defects generated at a Si—$SiO_2$ layer boundary in an active layer of the present invention.

And then, the wafer for an active layer 10 is put into the thermal oxidization furnace, and is subjected to a thermal oxidization process in an atmosphere of oxygen gas at 1000° C. for 0.5 hours. Thereby, a silicon oxide film 10*a* having a thickness of 0.05 μm is formed in the wafer for an active layer 10 (see FIG. 1(*c*)). At this time, arsenic or antimony in the ion implantation layer I is diffused thermally in a vicinity of the surface of the wafer for an active layer 10, thereby an n$^+$ layer (a high density impurity layer) 10*b* is formed. Furthermore, lattice defects (dislocations or stacking faults) R which are gettering sites are formed between the silicon oxide film 10*a* and the n+ layer 10*b*. That is, since the silicon oxide film 10*a* is formed in the atmosphere of oxygen gas, a plurality of interstitial silicons are generated at or in a vicinity of a Si—$SiO_2$ interface, and these interstitial silicons are accumulated at portions damaged by ion implantation, thereby lattice defects are generated (see FIGS. 2 and 3).

And then, the wafer for an active layer 10 is immersed into a hydrofluoric acid solution having a concentration of 10 mass % (at room temperature) for ten minutes. At this time, the silicon oxide film 10*a* is removed together with metallic contaminants adhered to its surface (see FIG. 1(*d*)). The surface of the wafer for an active layer 10 may be contaminated by metallic contaminants such as boron, aluminum, or the like due to, for example, cross contamination during the ion implantation process. These metallic contaminants are taken into the silicon oxide film 10*a* during the formation of the silicon oxide film 10*a*. Therefore, by removing this oxide film 10*a*, metallic impurities are also removed from the wafer for an active layer 10. Here, some of the lattice defects R remain at or in the vicinity of the Si—$SiO_2$ interface of the wafer for an active layer 10. Next, the wafer for an active layer 10 is subjected to SC-1 cleaning and SC-2 cleaning so as to clean the surface of the wafer for an active layer 10.

And then, the surface of the wafer for an active layer 10 (lattice defects R side surface) and a mirror polished surface of the wafer for the support substrate 20 are bonded together at room temperature in a clean room (see FIG. 1(e)). Thereby, a bonded wafer 30 is formed. At this time, a portion of the silicon oxide film 20a which is sandwiched between these two wafers 10 and 20 becomes a buried silicon oxide film (a buried insulating film) 20b.

Next, the bonded wafer 30 is placed in a thermal oxidization furnace for bonding, and is subjected to a heat-treating for bonding in an atmosphere of oxygen gas at 1100° C. for two hours (see FIG. 1(e)).

And then, void detection is performed using ultrasonic irradiation. For the bonded wafer 30 to be of good quality, in order to remove defective bonding regions caused by shapes of chamfered outer peripheral portions of both of the wafers 10 and 20, the outer peripheral portions of the wafer for an active layer 10 are ground from the device fabrication surface side using a metal-bonded grinding stone of #800 to #1500 quality (see FIG. 1(f)). If such defective bonding regions are present, the defective bonding regions will be peeled away during subsequent washing, polishing, and the like, thereby a surface of an SOI layer 10A will be contaminated or damaged. This grinding of the outer peripheral portion is stopped before reaching a bonded boundary surface. A thickness of a remaining non-ground portion 10c of the outer peripheral portion of the wafer is about 30 μm.

Next, the remaining non-ground portion 10c is removed by alkali etching (see FIG. 1(g)). In detail, the bonded wafer 30 is immersed into an alkaline etching solution such as KOH or the like, thereby the remaining non-ground portion 10c is dissolved. Accordingly, the outer peripheral portion of the wafer for the support substrate 20 is exposed, in detailed terms, the outer peripheral portion of the buried silicon oxide film 20b is exposed.

And then, the wafer for an active layer 10 is ground from its device fabrication surface side using a resinoid grinding stone of #360 to #2000 quality (see FIG. 1(h)). A grinding amount is in a range from 650 to 700 μm, and a thickness of the SOI layer 10A after grinding is about 20 μm.

Next, the ground surface of the wafer for an active layer 10 is polished (also see FIG. 1(h)). In detail, the bonded wafer 30 is held to a lower surface of a polishing head of a batch-type polishing device not shown in the figures so that a wafer for an active layer 10 side faces downwards. And then, the polishing head is gradually lowered while being rotated at 60 rpm, and the ground surface of the wafer for an active layer 10 is pressed at a predetermined polishing pressure against a polishing cloth on a polishing plate rotating at 60 rpm so as to polish the surface. This polishing cloth is a soft non-woven fabric pad of Suba 600 (Asker hardness of 80°) manufactured by Roder Co. Ltd. A polishing amount is in a range from 10 to 15 μm.

Thereby, a bonded SOI substrate 40 is manufactured in which the SOI layer 10A having an n/n$^+$ (including lattice defects)/SiO$_2$ structure is formed (see FIG. 1(h)).

Next, the obtained bonded SOI substrate 40 is washed and packed in a wafer case or the like, and then delivered to a device maker.

Since lattice defects R are formed in the n+ layer 10b of the SOI layer 10A in this manner, metallic impurities present in the SOI layer 10A are gettered by the lattice defects R such as dislocations or stacking faults during thermal processing of a device process. As a result, it is possible to suppress deterioration of device characteristics caused by generation of lattice defects and formation of electrical potentials in a vicinity of a surface of the SOI layer 10A due to metallic contamination of metallic impurities in the SOI layer 10A. Accordingly, yield rate of the devices can be improved.

Also, since the silicon oxide film 20a for the buried silicon oxide film 20b is formed only in the wafer for a support substrate 20, an increase in a thickness of the n$^+$ layer 10b can be suppressed in a subsequent thermal processing process. Accordingly, it is possible to shorten a time period for forming trench grooves not shown in figures in a device process. Therefore, it becomes possible to reduce the manufacturing cost of the device.

It should be understood that, although an ion implantation method is described as a method for forming the high density impurity layer, it is a matter of course that the present invention should not be considered as being limited thereto. For example, it would also be possible to employ a method for growing an epitaxial layer of high density on a surface of a low density silicon substrate, or the like. As described above, the gettering sites can be formed by any appropriate method.

EXAMPLE 2

Next, referring to FIG. 4, a bonded SOI substrate and a method for manufacturing the same of Example 2 of the present invention will be explained below.

Figure 4:
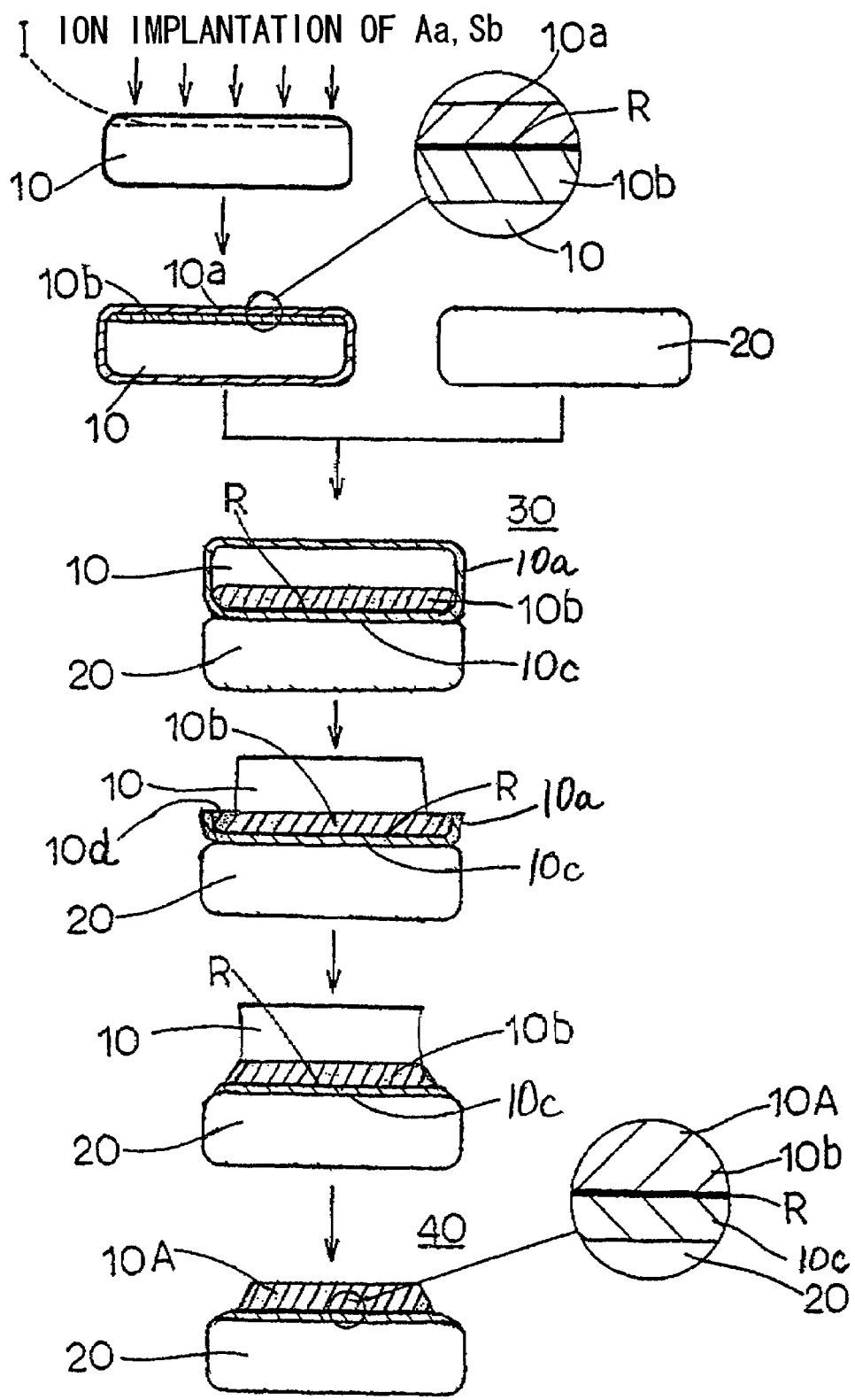
FIG. 4 is a flow diagram showing a method for manufacturing a bonded SOI substrate according to Example 2 of the present invention.
Figure 5:
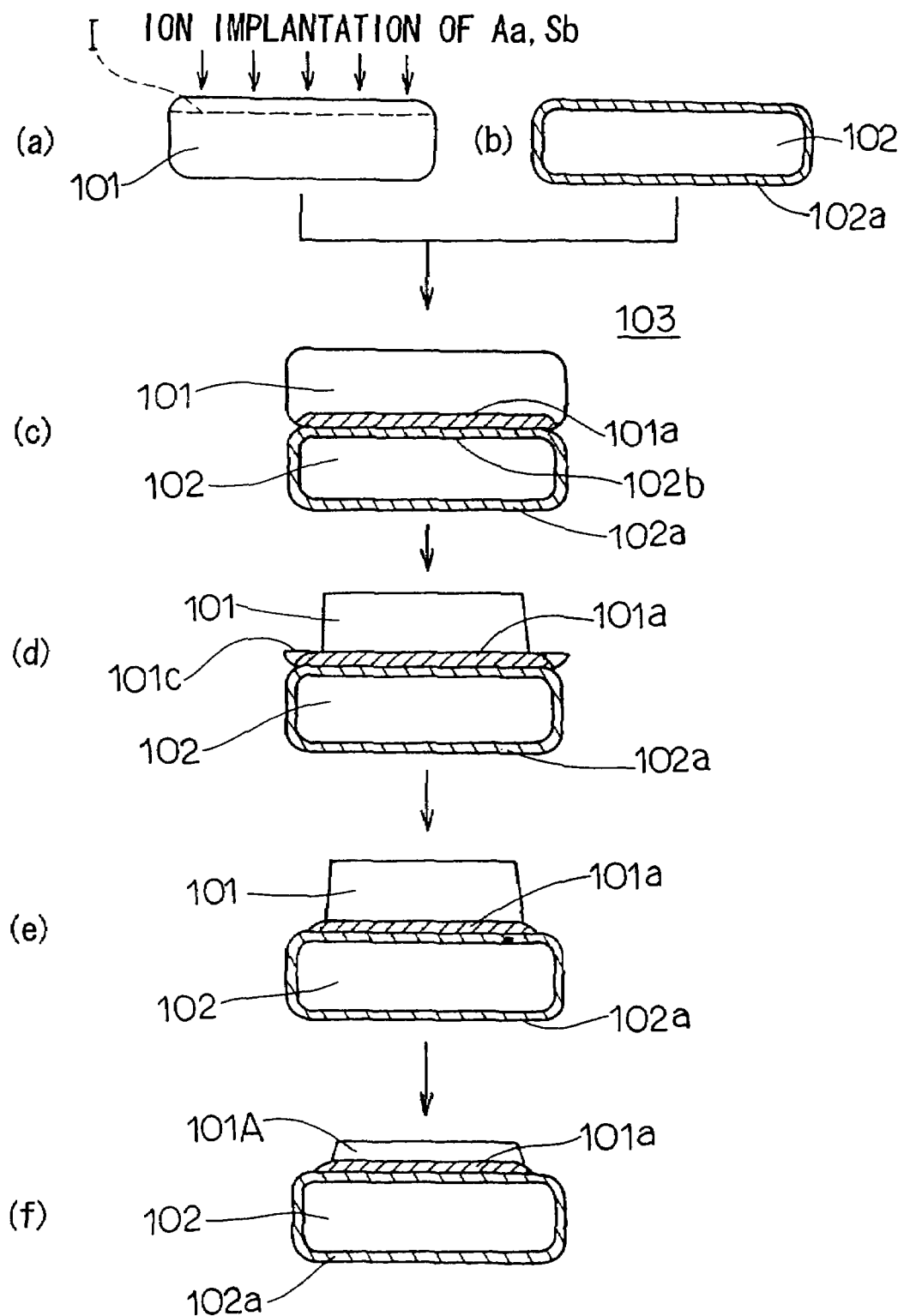
FIG. 5 is a flow diagram showing a method for manufacturing a bonded SOI substrate according to prior art.

As shown in FIG. 4, a non-doped single crystal silicon ingot is pulled up by the CZ method. And then, the obtained single crystal silicon ingot is subjected to block cutting, a notching process, slicing, chamfering, mirror polishing of a surface, and the like. Thereby, a mirror-polished non-doped wafer for an active layer 10 of 8 inches in diameter is prepared (see FIG. 4(a)). In contarst, a similar mirror-polished wafer 20 for a support substrate is prepared by the same manufacturing process as for the wafer for an active layer 10 (see FIG. 4(b)).

Next, from a surface of the wafer for an active layer 10, arsenic or antimony is implanted at, for example, an implantation energy of 60 keV and a dose amount of $1\times10^{15}$ atoms/cm$^2$. Thereby, an ion implantation layer I is formed at a predetermined depth in a surface layer of the wafer for an active layer 10. At this time, a portion of the ion implantation layer I located in the wafer for an active layer becomes amorphous.

And then, the wafer for an active layer 10 is put into a thermal oxidization furnace, and is subjected to a thermal oxidization process in an atmosphere of oxygen gas at 1150° C. for 2 hours. Thereby, a silicon oxide film 10a having a thickness of 1 μm is formed in the wafer for an active layer 10 (see FIG. 4(c)). At this time, arsenic or antimony in the ion implantation layer I is diffused thermally in a vicinity of the surface of the wafer for an active layer 10, thereby an n layer 10b is formed. Furthermore, lattice defects R which are gettering sites are formed between the silicon oxide film 10a and the n layer 10b. That is, since the silicon oxide film 10a is formed in the atmosphere of oxygen gas, a plurality of interstitial oxygens and interstitial silicons are generated at or in a vicinity of a Si—SiO$_2$ interface, and these interstitial oxygens and interstitial silicons are accumulated at portions damaged by ion implantation, thereby lattice defects R are generated (see FIGS. 2 and 3).

Next, the wafer for an active layer 10 is subjected to SC-1 cleaning and SC-2 cleaning so as to clean the surface of the wafer for an active layer 10.

And then, the surface of the wafer for an active layer and a mirror polished surface of the wafer for the support substrate 20 are bonded together at room temperature in a clean room (see FIG. 4(d)). Thereby, a bonded wafer 30 is formed. At this time, a portion of the silicon oxide film 10a which is sandwiched between these two wafers 10 and 20 becomes a buried silicon oxide film 10c.

Next, the bonded wafer 30 is placed in a thermal oxidization furnace for bonding, and is subjected to heat-treating for bonding in an atmosphere of oxygen gas at 1100° C. for two hours (see FIG. 4(d)).

And then, void detection is performed using ultrasonic irradiation. For the bonded wafer 30 to be of good quality, in order to remove defective bonding regions, outer peripheral portions of the wafer for an active layer 10 are ground from the device fabrication surface side using a metal-bonded grinding stone of #800 to #1500 quality (see FIG. 4(e)). A thickness of a remaining non-ground portion 10d of the outer peripheral portion of the wafer is about 50 µm.

Next, the remaining non-ground portion 10d is removed by alkali etching such as KOH or the like (see FIG. 4(g)). Accordingly, the outer peripheral portion of the wafer for the support substrate 20 is exposed.

And then, the wafer for an active layer 10 is ground from its device fabrication surface side using a resinoid grinding stone of #360 to #2000 quality (see FIG. 4(g)). A thickness of the SOI layer 10A after grinding is about several tens of micrometers.

Next, the ground surface of the wafer for an active layer 10 is polished (also see FIG. 4(g)). In detail, the bonded wafer 30 is held to a lower surface of a polishing head of a batch-type polishing device not shown in the figures so that a wafer for an active layer 10 side faces downwards. And then, the polishing head is gradually lowered while being rotated at 60 rpm, and the ground surface of the wafer for an active layer is pressed at a predetermined polishing pressure against a polishing cloth on a polishing plate rotating at 60 rpm so as to polish the surface. This polishing cloth is a soft non-woven fabric pad of Suba 600 (Asker hardness of 80°) manufactured by Roder Co. Ltd. A polishing amount is about 10 µm.

Thereby, a bonded SOI substrate 40 is manufactured in which the SOI layer 10A of an n(including lattice defects R)/SiO$_2$ structure is formed (see FIG. 4(g)).

Next, the obtained bonded SOI substrate 40 is washed and packed in a wafer case or the like, and then delivered to a device maker.

Since lattice defects R are formed in the n layer 10b of the SOI layer 10A in this manner, metallic impurities present in the SOI layer 10A are gettered by the lattice defects R such as dislocations or stacking faults during thermal processing of a device process. As a result, it is possible to suppress deterioration of device characteristics which is caused by generation of lattice defects and formation of electrical potentials in a vicinity of a surface of the SOI layer 10A due to metallic contamination in the SOI layer 10A. Accordingly, yield rate of the devices can be improved.

Also, when the wafer for an active layer 10 is subjected to the thermal oxidization process, the amorphous layer which is formed by the ion implantation is recrystallized by heat. However, since the wafer for an active layer 10 is heat-treated in the atmosphere of oxygen gas, interstitial oxygen and interstitial silicons are supplied to the amorphous layer. Thereby, the wafer for an active layer 10 is prevented from becoming a single crystal and lattice defects such as dislocations and stacking faults are generated. Furthermore, the implanted dopants are thermally diffused in the wafer for an active layer 10 when forming the oxide film. This thermal diffusion is promoted by the subsequent heat-treating for bonding. Here, under conditions of heat-treating for bonding, it is impossible to make the amorphous layer be a perfect single crystal. Therefore, a portion of the amorphous layer remains as lattice defects R in the buried oxide film 10c side of the SOI layer 10A.

As a result, compared with a prior art by which a variation in resistance of the SOI layer among wafers is 150% and a variation in resistance of the SOI layer in the in-plane direction of the wafer is 10%, each of the variations can be reduced to 5% or less (3% or less in the Example).

Furthermore, gettering sites are formed in a buried silicon oxide film 10c side of the SOI layer 10A. Therefore, metallic impurities adhered on a surface of the SOI layer 10A and metallic impurities present in the SOI layer 10A can be gettered in the SOI layer 10A during thermal processing in a device process. In particular, the effects are quite noticeable for the case in which the metallic impurities in the SOI layer are iron, nickel or the like, which are hard to spread thermally in the buried silicon oxide film.

As stated above, a resistance of the SOI layer 10A is determined by ion implantation conditions for the wafer for an active layer 10 and heat-treating conditions for the bonded wafer 30. Therefore, the bonded SOI substrate 40 can be manufactured in which variation in resistance of the SOI layer 10A among wafers and variation in resistance of the SOI layer 10A in the in-plane direction are low. When the ion implantation layer I which becomes amorphous is recrystallized, lattice defects R are generated. Thereby, gettering sites including lattice defects R are formed in the buried silicon oxide film 10c side of the SOI layer 10A.

In Example 2, an oxide film may be formed in the wafer for a support substrate 20 in advance.

In Example 2, arsenic or antimony is used as a dopant: These dopants are hard to be taken in the silicon oxide film when the wafer for an active layer is subjected to the thermal oxidization treatment. Therefore, after the thermal oxidization treatment, dopant concentration increases in a vicinity of the wafer for an active layer 10 side of the buried silicon oxide film 10c. However, due to reheating in heat-treating for bonding, in the wafer for an active layer 10 having portions in which the dopants are present at high concentration, the dopant concentration is equalized. Thereby, the resistances of the bonded SOI substrate 40 among the wafers and the resistance of the bonded SOI substrate 40 in the in-plane direction of the wafer are made uniform.

In the case in which boron is used as the dopant, boron is taken in the silicon oxide film 10c during the thermal oxidization treatment. Thereby, dopant concentration decreases in a vicinity of the SOI layer 10A side of the buried silicon oxide film 10c. However, due to reheating in heat-treating for bonding, in the wafer for an active layer 10 having portions in which the dopants are present at high concentration, the dopant concentration is equalized. Thereby, the resistances of the bonded SOI substrate 40 among the wafers and the resistance of the bonded SOI substrate 40 in the in-plane direction of the wafer are made uniform.

In both cases, if the dopant concentration is not equalized during the thermal oxidation treatment, after the thermal oxidation treatment, the wafer for an active layer 10 is subjected to thinning and further heat-treating, thereby the equalization (uniformization of each of the resistances) can be realized. This heat-treating may be conducted in a wafer manufacturing process or a device process.

As the wafer for an active layer 10, wafers other than the non-doped wafers, or low-dose-amount wafers in which dopants are present at low density such as the wafers used in the Example 1 may be used.

Before the ion implantation in the wafer for an active layer 10, a through oxide film not shown in the figures may be formed in the wafer for an active layer 10. Here, the through oxide film is a silicon oxide film which prevents contamination of boron, aluminum, or the like in the wafer for an active layer due to cross contamination or the like during the ion implantation. The through oxide film is removed from the wafer for an active layer together with boron or aluminum by contacting with hydrofluoric acid solution after the ion implantation.

In the wafer for a support substrate, an oxide film may be formed in advance.

After bonding, the wafer for an active layer may be subjected to the heat-treating for bonding after thinning. In this case, since a thickness of the SOI layer 10A is thin, uniformization of the resistances among the wafers and the resistance in the in-plane direction can be promoted.

In the SOI layer 10A, a portion in which implanted dopants are not diffused thermally may remain. In this case, the resistances among the wafers and the resistance in the in-plane direction can be made uniform during thermal processing of a device process.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A bonded SOI substrate, comprising:
   an SOI layer having a low density dopend impurity layer and a high density doped impurity layer which is adjacent to the low density doped impurity layer and in which dopants are present at a high density that is higher than that of the low density doped impurity layer;
   a wafer for a support substrate which supports said SOI layer; and
   a buried insulating film which bonds said SOI layer with said wafer for a support substrate,
   wherein said high density doped impurity layer is positioned on said buried insulating layer,
   the low density doped impurity layer is positioned on the high density doped impurity layer, and
   gettering sites including lattice defects are formed by heat-treating the high density doped impurity layer and are positioned at the boundary between the high density doped impurity layer and the buried insulated film.

2. The bonded SOI substrate according to claim 1, wherein said gettering sites are dislocations or stacking faults.

3. A bonded SOI substrate, comprising:
   an SOI layer having low density doped impurity layer and a high density doped impurity layer which is adjacent to the low density doped impurity layer obtained by heat-treating an ion implantation layer in which dopants are implanted at a high density that is higher than that of the low density doped impurity layer;
   a wafer for a support substrate which supports said SOI layer; and
   a buried insulating film which bonds said SOI layer with said wafer for a support substrate,
   wherein the high density doped impurity layer is positioned on the buried insulating layer,
   the low density doped impurity layer is positioned on the high density doped impurity layer, and
   gettering sites including lattice defects are formed by heat-treating the ion implantation layer and are positioned at the boundary between the high density doped impurity layer and the buried insulating film.

4. The bonded SOI substrate according to claim 3, wherein said gettering sites are dislocations or stacking faults.

5. The bonded SOI substrate according to claim 1, wherein the dopant density of the high density impurity layer is $1\times10^{18}$ atoms/cm$^3$ or more.

6. The bonded SOI substrate according to claim 2, wherein size of the dislocations is in a range from 0.01 to 0.10 μm.

7. The bonded SOI substrate according to claim 2, wherein density of the dislocations and density of the stacking faults are in a range from $1\times10^0$ to $1\times10^7$/cm$^2$.

8. The bonded SOI substrate according to claim 3, wherein the dopant density of the high density impurity layer is $1\times10^{18}$ atoms/cm$^3$ or more.

9. The bonded SOI substrate according to claim 4, wherein size of the dislocations is in a range from 0.01 to 0.10 μm.

10. The bonded SOI substrate according to claim 4, wherein density of the dislocations and density of the stacking faults are in a range from $1\times10^0$ to $1\times10^7$/cm$^2$.

* * * * *